(12) United States Patent
Ningaraju et al.

(10) Patent No.: US 10,096,723 B1
(45) Date of Patent: Oct. 9, 2018

(54) SEMICONDUCTOR DEVICE

(71) Applicant: Nuvoton Technology Corporation, Hsinchu (TW)

(72) Inventors: Vivek Ningaraju, Hsinchu (TW); Po-An Chen, Hsinchu (TW); Subramanya Jayasheela Rao, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 15/871,020

(22) Filed: Jan. 14, 2018

(30) Foreign Application Priority Data

May 10, 2017 (TW) .............................. 106115476 A

(51) Int. Cl.
*H01L 29/872* (2006.01)
*H01L 27/06* (2006.01)
*H01L 29/06* (2006.01)
*H01L 29/10* (2006.01)
*H01L 29/66* (2006.01)
*H01L 27/08* (2006.01)
*H01L 29/78* (2006.01)
*H01L 29/47* (2006.01)

(52) U.S. Cl.
CPC ............ *H01L 29/872* (2013.01); *H01L 27/06* (2013.01); *H01L 27/0814* (2013.01); *H01L 29/0696* (2013.01); *H01L 29/1095* (2013.01); *H01L 29/66143* (2013.01); *H01L 29/782* (2013.01); *H01L 29/0619* (2013.01); *H01L 29/47* (2013.01); *H01L 2924/12032* (2013.01); *H01L 2924/14* (2013.01)

(58) Field of Classification Search
CPC . H01L 27/06; H01L 27/0814; H01L 29/0696; H01L 29/1095; H01L 29/47; H01L 29/66143; H01L 29/782; H01L 29/872
See application file for complete search history.

(56) References Cited

U.S. PATENT DOCUMENTS

| 4,956,308 | A | * | 9/1990 | Griffin | ................ H01L 29/1029 148/DIG. 105 |
| 5,109,256 | A | * | 4/1992 | De Long | ................ H01L 29/872 257/281 |
| 6,351,018 | B1 | | 2/2002 | Sapp | |
| 6,949,454 | B2 | * | 9/2005 | Swanson | ................ H01L 21/765 257/484 |

(Continued)

FOREIGN PATENT DOCUMENTS

TW 200723508 6/2007

*Primary Examiner* — Allan R Wilson
(74) *Attorney, Agent, or Firm* — JCIPRNET

(57) ABSTRACT

A semiconductor device including a substrate, an isolation structure, a diode element, and a first metal layer is provided. The isolation structure is located in the substrate. The diode element is located on the isolation structure. The diode element includes a p-type doped region, an n-type doped region, and an intrinsic region, and the intrinsic region is located between the p-type doped region and the n-type doped region. The p-type doped region and the n-type doped region located on two sides of the diode element respectively form ohmic contacts. The first metal layer and the intrinsic region of the diode element are electrically connected and form a Schottky contact, so as to constitute at least one Schottky barrier diode.

8 Claims, 5 Drawing Sheets

(56) References Cited

U.S. PATENT DOCUMENTS

| | | | |
|---|---|---|---|
| 8,519,478 B2* | 8/2013 | Rassel | G06F 17/5068 257/335 |
| 8,686,502 B2* | 4/2014 | Raghavan | H01L 29/1095 257/337 |
| 9,876,104 B2* | 1/2018 | Matocha | H01L 27/0629 |
| 2006/0145185 A1 | 7/2006 | Mallikarjunaswamy | |
| 2007/0176252 A1* | 8/2007 | Coolbaugh | H01L 29/0657 257/458 |
| 2010/0148253 A1 | 6/2010 | Tu et al. | |
| 2012/0161224 A1* | 6/2012 | Eckel | H01L 27/0629 257/328 |
| 2014/0131710 A1* | 5/2014 | Chung | H01L 29/66113 257/49 |
| 2016/0064475 A1* | 3/2016 | Feilchenfeld | H01L 29/868 257/484 |

* cited by examiner

SEMICONDUCTOR DEVICE

CROSS-REFERENCE TO RELATED APPLICATION

This application claims the priority benefits of Taiwan application serial no. 106115476, filed on May 10, 2017. The entirety of the above-mentioned patent application is hereby incorporated by reference herein and made a part of this specification.

BACKGROUND OF THE INVENTION

1. Field of the Invention

The invention relates to a semiconductor device. More particularly, the invention relates to a semiconductor device integrating a diode element and a Schottky barrier diode.

2. Description of Related Art

In a conventional semiconductor device, in order to lower shoot through currents, a Schottky barrier diode is used most of the time to protect the semiconductor device and reduce a conducting resistance and a gate capacitance, and thereby power consumptions can be reduced and switching speeds of a semiconductor power element can be increased. According to the related art, the Schottky barrier diode is integrated with a metal oxide silicon field effect transistor (MOSFET) through external connection, or the Schottky barrier diode and the MOSFET are packaged together. Nevertheless, a conventional Schottky barrier diode requires much space and high manufacturing costs, and thus, how to enhance device performance, reduce device size, and save costs has become important issues.

SUMMARY OF THE INVENTION

The invention provides a semiconductor device in which a Schottky barrier diode and a diode element are integrated so as to reduce device size and enhance device performance.

A semiconductor device provided by an embodiment of the invention includes a substrate, an isolation structure, a diode element, and a first metal layer. The isolation structure is located in the substrate. The diode element is located on the isolation structure, and the diode element includes a p-type doped region, an n-type doped region, and an intrinsic region. The intrinsic region is located between the p-type doped region and the n-type doped region, and the p-type doped region and the n-typed doped region located on two sides of the diode element respectively form ohmic contacts. The first metal layer and the intrinsic region of the diode element are electrically connected and form a Schottky contact, so as to constitute at least one Schottky barrier diode.

In an embodiment of the invention, the intrinsic region of the diode element includes a main body portion and at least one protruding portion connected to the main body portion. The at least one protruding portion extends into the p-type doped region, and the first metal layer is electrically connected to the at least one protruding portion of the intrinsic region and the p-type doped region to constitute the at least one Schottky barrier diode.

In an embodiment of the invention, the semiconductor device further includes a transistor located in an active region. The transistor includes a gate, a first doped region, and a second doped region. The gate is located on the substrate, and the first doped region and the second doped region are respectively located in the substrate on two sides of the gate.

In an embodiment of the invention, the p-type doped region of the diode element is disposed adjacent to one of the first doped region and the second doped region, and the n-type doped region is disposed adjacent to the other one of the first doped region and the second doped region.

In an embodiment of the invention, the isolation structure is located between the second doped region and the gate, and the diode element is located on the isolation structure between the second doped region and the gate.

In an embodiment of the invention, the first metal layer is electrically connected to one of the first doped region and the second doped region of the transistor.

In an embodiment of the invention, the semiconductor device further includes a second metal layer, and the second metal layer is electrically connected to the other one of the first doped region and the second doped region and is electrically connected to the n-type doped region.

In an embodiment of the invention, the diode element is disposed on the isolation structure, and the p-type doped region, the n-type doped region, and the intrinsic region are respectively in contact with the isolation structure.

To sum up, in the semiconductor device provided by the embodiments of the invention, as the first metal layer and the intrinsic region of the diode element are electrically connected and form the at least one Schottky barrier diode, the at least one Schottky barrier diode and the diode element can be integrated; therefore, device performance can be effectively enhanced, device size can be effectively reduced, and costs can be effectively saved.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
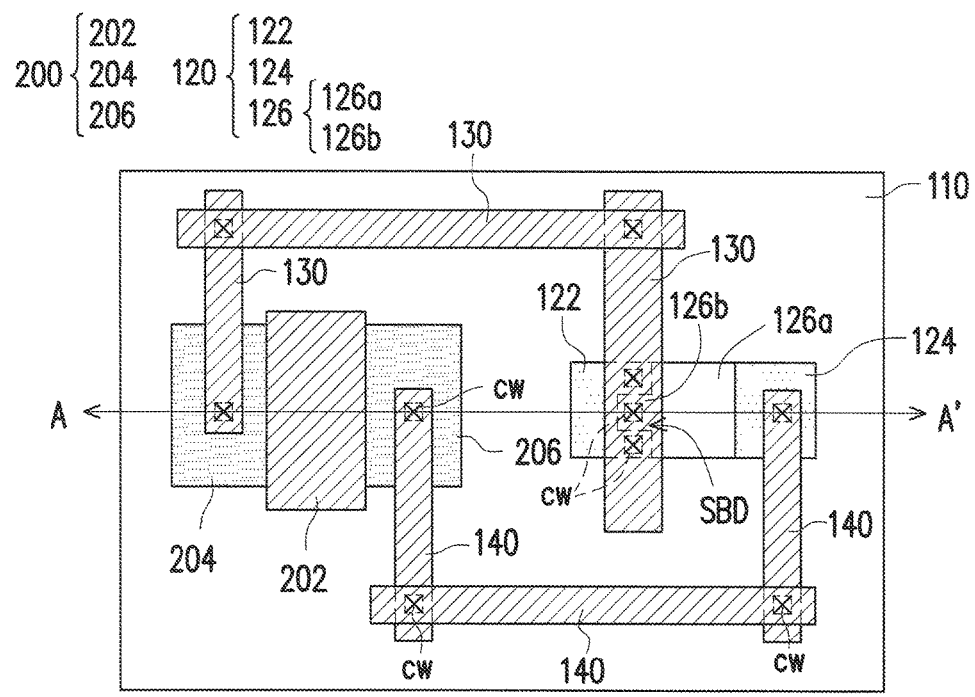
FIG. 1A is a schematic top view of a semiconductor device according to an embodiment of the invention.

FIG. 1A is a schematic top view of a semiconductor device according to an embodiment of the invention. FIG.

Figure 1B:
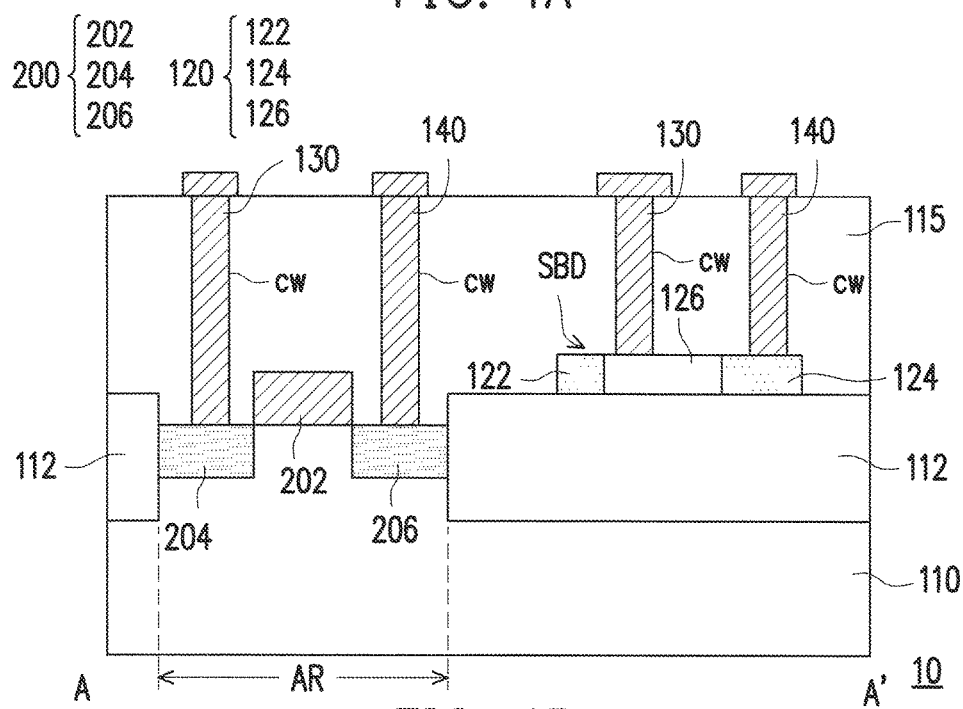
FIG. 1B is a cross-sectional view taken along a line A-A' in FIG. 1A.
Figure 1C:
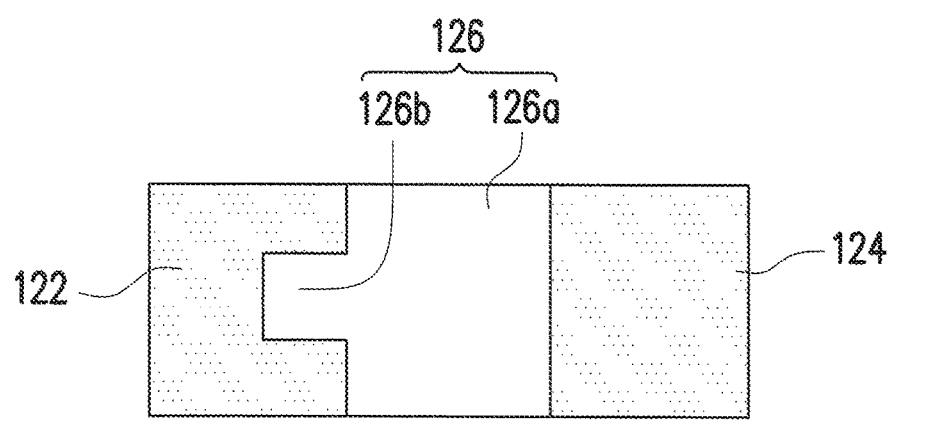
FIG. 1C is a schematic top view of the diode element 120 in FIG. 1A.

1B is a cross-sectional view taken along a line A-A' in FIG. 1A. FIG. 1C is a schematic top view of the diode element 120 in FIG. 1A. Referring to FIG. 1A, FIG. 1B, and FIG. 1C, in the embodiment, a semiconductor device 10 includes a substrate 110, an isolation structure 112, a diode element 120, a first metal layer 130, a second metal layer 140, and a transistor 200. In the embodiment, the substrate 110 includes a silicon substrate, a silicon on insulator (SOI) substrate, or an III-V group semiconductor substrate, but the invention is not limited thereto. Besides, the III-V group semiconductor substrate may be a silicon carbide (SiC) substrate, a gallium arsenide (GaAs) substrate, or a gallium nitride (GaN) substrate.

As shown in the embodiment of FIG. 1A and FIG. 1B, the semiconductor device 10, for example, corresponds to a metal oxide semiconductor field effect transistor (MOS-FET). Specifically, the semiconductor device 10 provided by the embodiment includes the transistor 200 located in an active region AR. The transistor 200 includes a gate 202, a first doped region 204, and a second doped region 206. The gate 202 is disposed on the substrate 110, and the first doped region 204 and the second doped region 206 are respectively located in the substrate 110 on two sides of the gate 202. The first doped region 204 may be, for example, one of a source region and a drain region of the transistor 200, and the second doped region 206 may be, for example, the other one of the source region and the drain region of the transistor 200. In addition, as shown in FIG. 1B, the isolation structure 112 is disposed in the substrate 110 and acts as an element to isolate the transistor 200 for defining the active region AR (the isolation structure 112 is omitted in FIG. 1A). In the embodiment, the isolation structure 112 may be a shallow trench isolation (STI) layer, but the invention is not limited thereto. In other embodiments, the isolation structure 112 may be a buried oxide (BOX) layer or a field oxide (FOX) layer. Besides, a material of the isolation structure 112 may include, for example, silicon oxide.

In the embodiment, the diode element 120 is disposed on the isolation structure 112, and the diode element 120 is, for example, a PIN diode. Besides, the diode element 120 is an additionally formed doped polysilicon layer, mono-crystalline silicon layer, or amorphous silicon layer. The diode element 120 includes a p-type doped region 122, an n-type doped region 124, and an intrinsic region 126. The intrinsic region 126 is a non-doped region, and a carrier concentration of the intrinsic region 126 is kept as an intrinsic concentration of a silicon material and is significantly lower than carrier concentrations of the p-type doped region 122 and the n-type doped region 124. In addition, in the embodiment, the p-type doped region 122, the n-type doped region 124, and the intrinsic region 126 of the diode element 120 are respectively disposed on the isolation structure 112 and are in contact with the isolation structure 112. In other words, the p-type doped region 122, the n-type doped region 124, and the intrinsic region 126 of the diode element 120 are horizontally disposed on the isolation structure 112.

Again, referring to FIG. 1A, FIG. 1B, and FIG. 1C, in the embodiment, the intrinsic region 126 of the diode element 120 has a main body portion 126a and at least one protruding portion 126b connected to the main body portion 126a, and the at least one protruding portion 126b extends into the p-type doped region 122. The p-type doped region 122 and the n-type doped region 124 located on two sides of the diode element 120 respectively form ohmic contacts. In addition, the first metal layer 130 is electrically connected to the protruding portion 126b of the intrinsic region 126 and the p-type doped region 122, and the first metal layer 130, the protruding portion 126b, and the p-type doped region 122 form a Schottky contact, so as to constitute a Schottky barrier diode SBD. Specifically, as shown in FIG. 1B, the diode element 120 and the transistor 200 are covered by an insulation layer 115 (the insulation layer 115 is omitted in FIG. 1A). The first metal layer 130 is electrically connected to the protruding portion 126b of the intrinsic region 126 and the p-type doped region 122 through a contact opening CW of the insulation layer 115. Similarly, the first metal layer 130 is electrically connected to the first doped region 204 of the transistor 200 through the contact opening CW of the insulation layer 115. In the embodiment, a material of the first metal layer 130 includes metal, such as aluminum, copper, or an alloy thereof. Thereby, the Schottky barrier diode SBD can be constituted through a metal-semiconductor junction formed between the metal material of the first metal layer 130 and the semiconductor material of the intrinsic region 126b, and a leakage current of the Schottky barrier diode SBD may be reduced because of a metal-semiconductor junction formed between the metal material of the first metal layer 130 and the p-type doped region 122 on two sides of the intrinsic region 126b.

In the embodiments of the invention, the first metal layer 130 may be electrically connected to one of the first doped region 204 and the second doped region 206, and the second metal layer 140 may be electrically connected to the other one of the first doped region 204 and the second doped region 206 and electrically connected to the n-type doped region 124. As shown in FIG. 1A and FIG. 1B, the first doped region 204 may be, for example, a source region, and the second doped region 206 may be, for example, a drain region. The first metal layer 130 is electrically connected to the first doped region 204, and the second metal layer 140 is electrically connected to the second doped region 206 and is electrically connected to the n-type doped region 124. In addition, as shown in FIG. 1B, the second metal layer 140 is electrically connected to the n-type doped region 124 and the second doped region 206 through the contact opening CW of the insulation layer 115. Nevertheless, the invention is not limited to the connecting methods described above. In another embodiment, the first doped region 204 may be, for example, the drain region, and the second doped region 206 may be, for example, the source region. Here, the first metal layer 130 is electrically connected to the second doped region 206, and the second metal layer 140 is electrically connected to the first doped region 204 and is electrically connected to the n-type doped region 124.

It thus can be seen that in any of the embodiments, as long as the first metal layer 130 is electrically connected to the intrinsic region 126 and one of the source region and the drain region, and the second metal layer 140 is connected to the n-type doped region 124 and the other one of the source region and the drain region, the connecting relationship described in the embodiments of the invention is achieved.

In the embodiments depicted in FIG. 1A, FIG. 1B, and FIG. 1C, as the first metal layer 130 is in contact with the intrinsic region 126 and the p-type doped region 122 of the diode element 120 through the contact opening CW to form the Schottky barrier diode SBD, the Schottky barrier diode SBD and the diode element 120 can be integrated to form an embedded structure. In other words, compared to the conventional Schottky barrier diode which is externally connected, in the semiconductor device 10 provided by the embodiments of the invention, the device size can be effectively reduced, and costs can be saved. Furthermore, when the diode element 120 and the Schottky barrier diode SBD are effectively integrated, the advantages of high punch-through voltage, fast switching speeds, and lowered shoot through currents can be achieved, and the overall performance of the device can be enhanced.

Figure 2A:
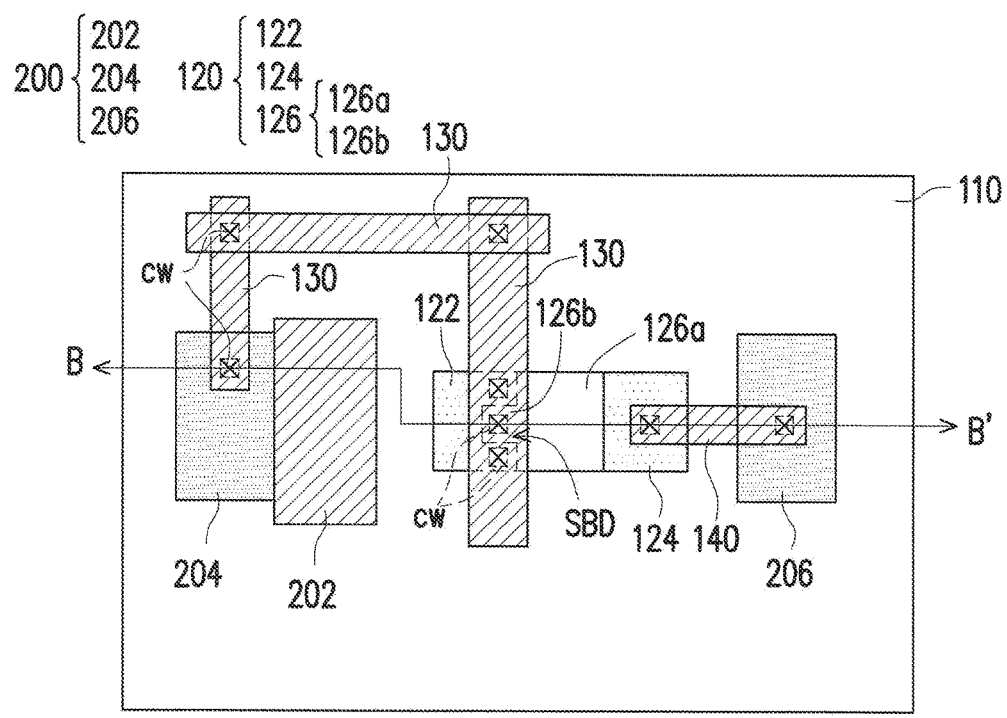
FIG. 2A is a schematic top view of a semiconductor device according to another embodiment of the invention.
Figure 2B:
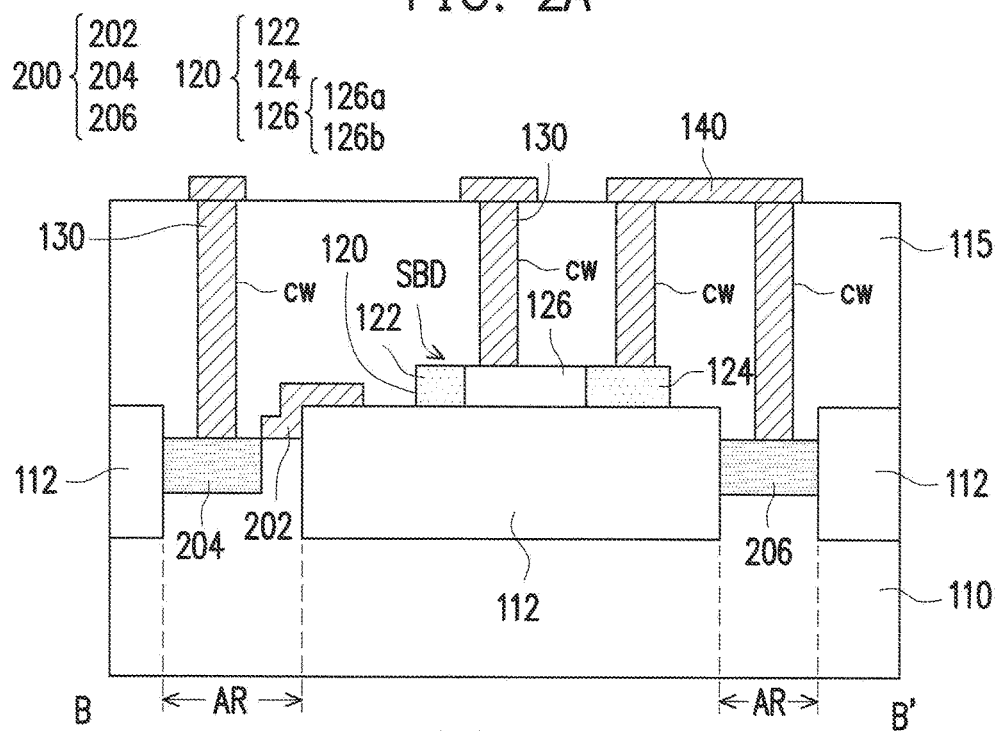
FIG. 2B is a cross-sectional view taken along a line B-B' in FIG. 2A.

FIG. 2A is a schematic top view of a semiconductor device according to another embodiment of the invention. FIG. 2B is a cross-sectional view taken along a line B-B' in FIG. 2A. The embodiment depicted in FIG. 2A and FIG. 2B is similar to that depicted in FIG. 1A, FIG. 1B, and FIG. 1C; therefore, identical elements are denoted by the same reference numerals, and details thereof will not be repeated hereinafter. The difference between FIG. 2A and FIG. 2B and FIG. 1A, FIG. 1B, and FIG. 1C lies in that a semiconductor device 20 in FIG. 2A and FIG. 2B, for example, corresponds to a lateral diffused metal oxide semiconductor (LDMOS).

As shown in FIG. 2A and FIG. 2B, the semiconductor device 20 includes the transistor 200 located in the active region AR. The transistor 200 includes the gate 202, the first doped region 204, and the second doped region 206. Here, the gate 202 is disposed on the substrate 110, and the first doped region 204 and the second doped region 206 are respectively located in the substrate 110 on the two sides of the gate 202. The first doped region 204 may be, for example, the source region of the transistor 200, and the second doped region 206 may be, for example, the drain region of the transistor 200. In addition, as shown in FIG. 2B, the isolation structure 112 is disposed in the substrate 110 for defining the active region AR (the isolation structure 112 is omitted in FIG. 2A). In the embodiment, the isolation structure 112 is a FOX layer, but the invention is not limited thereto. Besides, in the embodiment, the isolation structure 112 is located between the second doped region 206 and the gate 202, and the diode element 120 is located on the isolation structure 112 between the second doped region 206 and the gate 202. Nevertheless, the invention is not limited thereto. In another embodiment, the isolation structure 112 may be located between the first doped region 204 and the gate 202, and the diode element 120 is located on the isolation structure 112 between the first doped region 204 and the gate 202.

In the embodiment depicted in FIG. 2A and FIG. 2B, the first metal layer 130 is electrically connected to the protruding portion 126b of the intrinsic region 126 and the p-type doped region 122 through the contact opening CW of the insulation layer 115. The Schottky barrier diode SBD may be constituted through the metal-semiconductor junction formed between the metal material of the first metal layer 130 and the semiconductor material of the intrinsic region 126b. In addition, the leakage current of the Schottky barrier diode SBD may be lowered through the metal-semiconductor junction formed between the metal material of the first metal layer 130 and the p-type doped region 122 on the two sides of the intrinsic region 126b. In the embodiment, as the first metal layer 130 is in contact with the intrinsic region 126 and the p-type doped region 122 of the diode element 120 through the contact opening CW to form the Schottky barrier diode SBD, the Schottky barrier diode SBD and the diode element 120 can be integrated to form an embedded structure. In other words, compared to a conventional Schottky barrier diode which is externally connected, in the semiconductor device 20 provided by the embodiments of the invention, the device size may be effectively reduced, and costs may be saved. Furthermore, when the diode element 120 and the Schottky barrier diode SBD are effectively integrated, the advantages of high punch-through voltage, fast switching speeds, and lowered shoot through currents may be achieved, and the overall performance of the device may be enhanced.

Figure 3:
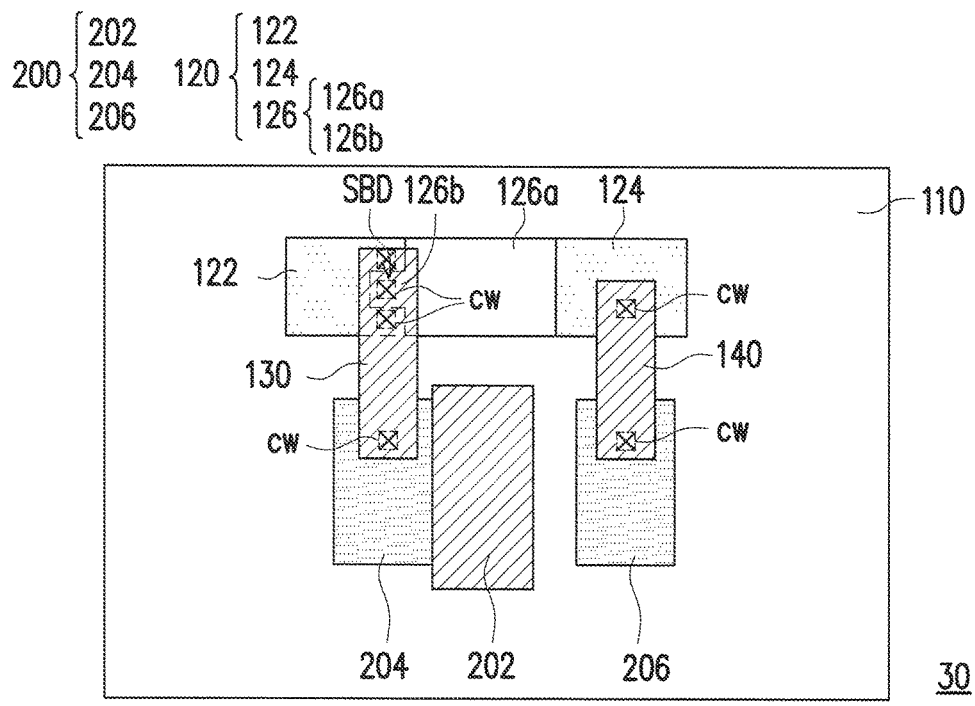
FIG. 3 is a schematic cross-sectional view of a semiconductor device according to another embodiment of the invention.

FIG. 3 is a schematic cross-sectional view of a semiconductor device according to another embodiment of the invention. The embodiment depicted in FIG. 3 is similar to the embodiment depicted in FIG. 2A; therefore, identical elements are denoted by the same reference numerals, and details thereof will not be repeated hereinafter. The difference between FIG. 3 and FIG. 2A lies in that the diode element 120 of a semiconductor device 30 in FIG. 3 is disposed at a location different from the location shown in FIG. 2A. Specifically, in the embodiment depicted in FIG. 3, the p-type doped region 122 of the diode element 120 is disposed adjacent to the first doped region 204, the n-type doped region 124 is disposed adjacent to the second doped region 206, and the intrinsic region 126 is disposed adjacent to the gate 202. Nevertheless, the invention is not limited thereto. In another embodiment, the p-type doped region 122 of the diode element 120 is disposed adjacent to the second doped region 206, the n-type doped region 124 is disposed adjacent to the first doped region 204, and the intrinsic region 126 is disposed adjacent to the gate 202. In addition, in the embodiment depicted in FIG. 3, the first metal layer 130 is electrically connected to the intrinsic region 126, the p-type doped region 122, and the first doped region 204 as well, and the second metal layer 140 is electrically connected to the n-type doped region 124 and the second doped region 206 as well. The only difference lies in that the first metal layer 130 and the second metal layer 140 are disposed in a manner to be adjusted in response to changes to the location of the diode element 120.

Similarly, in the embodiment of FIG. 3, as the first metal layer 130 is in contact with the intrinsic region 126 and the p-type doped region 122 of the diode element 120 through the contact opening CW to form the Schottky barrier diode SBD, the Schottky barrier diode SBD and the diode element 120 can be integrated to form an embedded structure. In other words, compared to the conventional Schottky barrier diode which is externally connected, in the semiconductor device 30 provided by the embodiments of the invention, the device size may be effectively reduced, and costs may be saved. Furthermore, when the diode element 120 and the Schottky barrier diode SBD are effectively integrated, the advantages of high punch-through voltage, fast switching speeds, and lowered shoot through currents may be achieved, and the overall performance of the device may be enhanced.

Figure 4:
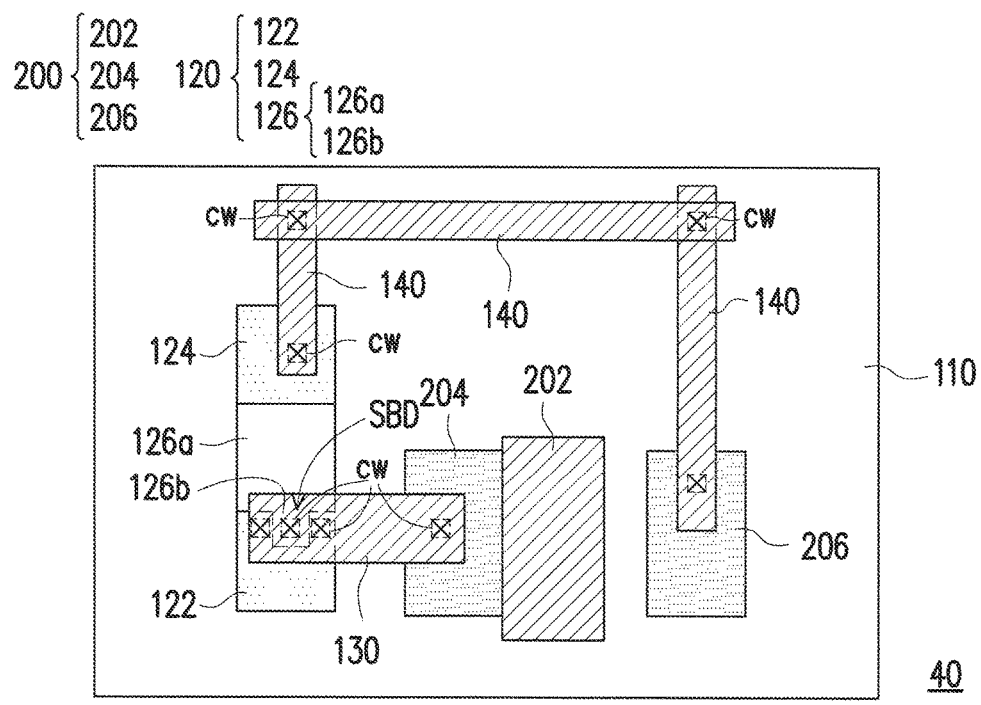
FIG. 4 is a schematic cross-sectional view of a semiconductor device according to another embodiment of the invention.

FIG. 4 is a schematic cross-sectional view of a semiconductor device according to another embodiment of the invention. The embodiment depicted in FIG. 4 is similar to that depicted in FIG. 2A; therefore, identical elements are denoted by the same reference numerals, and details thereof will not be repeated hereinafter. The difference between FIG. 4 and FIG. 2A lies in that the diode element 120 of a semiconductor device 40 in FIG. 4 is disposed at a location different from the location shown in FIG. 2A. Specifically, in the embodiment of FIG. 4, the diode element 120 is located on a side of the first doped region 204 of the transistor 200, is adjacent to the first doped region 204 of the transistor 200, and is located away from the second doped region 206. Nevertheless, the invention is not limited thereto. In another embodiment, the diode element 120 may be disposed on a side of the second doped region 206, adjacent to the second doped region 206 of the transistor 200, and away from the first doped region 204. In addition, in the embodiment, the first metal layer 130 is electrically connected to the intrinsic region 126, the p-type doped region 122, and the first doped region 204 as well, and the second metal layer 140 is electrically connected to the n-type doped region 124 and the second doped region 206 as well. The only difference lies in that the first metal layer 130 and the second metal layer 140 are disposed in a manner to be adjusted in response to changes to the locations of the diode element 120.

Similarly, in the embodiment of FIG. 4, as the first metal layer 130 is in contact with the intrinsic region 126 and the p-type doped region 122 of the diode element 120 through the contact opening CW to form the Schottky barrier diode SBD, the Schottky barrier diode SBD and the diode element 120 can be integrated to form an embedded structure. In other words, compared to the conventional Schottky barrier diode which is externally connected, in the semiconductor device 40 provided by the embodiments of the invention, the device size may be effectively reduced, and costs may be saved. Furthermore, when the diode element 120 and the Schottky barrier diode SBD are effectively integrated, the advantages of high punch-through voltage, fast switching speeds, and lowered shoot through currents may be achieved, and the overall performance of the device may be enhanced.

Figure 5:
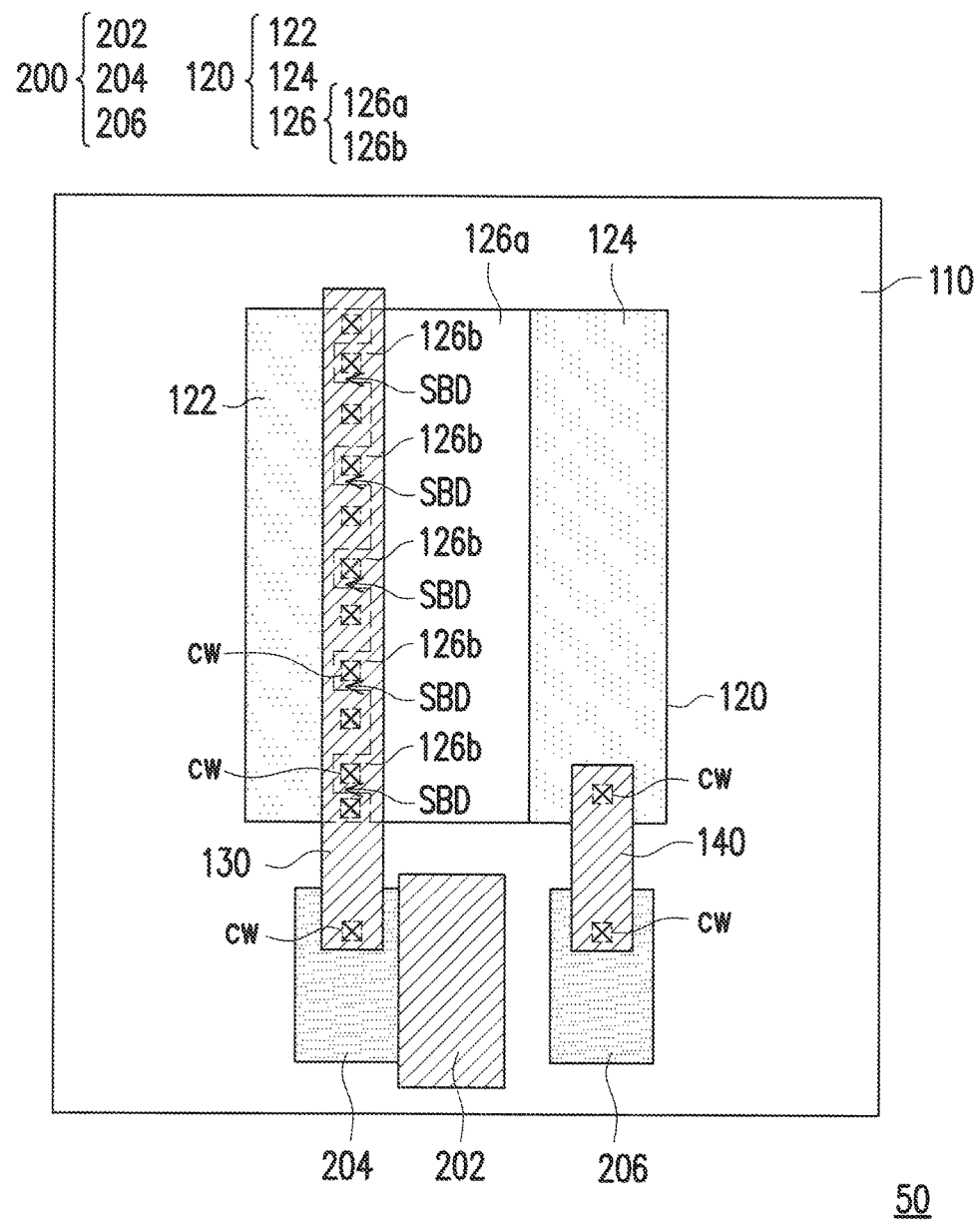
FIG. 5 is a schematic cross-sectional view of a semiconductor device according to another embodiment of the invention.

FIG. 5 is a schematic cross-sectional view of a semiconductor device according to another embodiment of the invention. The embodiment depicted in FIG. 5 is similar to that depicted in FIG. 3; therefore, identical elements are denoted by the same reference numerals, and details thereof will not be repeated hereinafter. The difference between FIG. 5 and FIG. 3 lies in that the intrinsic region 126 of the semiconductor device 50 has a plurality of protruding portions 126b to constitute the intrinsic region 126 with a finger-shaped appearance. Specifically, the first metal layer 130 extends above the protruding portions 126b and is electrically and respectively connected to the protruding portions 126b and the p-type doped region 122 of the diode element 120 through the contact opening CW to form the Schottky contact, so as to constitute a plurality of the Schottky barrier diodes SBD.

Similarly, in the embodiment depicted in FIG. 5, as the first metal layer 130 is in contact with the intrinsic region 126 and the p-type doped region 122 of the diode element 120 through the contact opening CW to form the Schottky barrier diodes SBD, the Schottky barrier diodes SBD and the diode element 120 can be integrated to form an embedded structure. In other words, compared to the conventional Schottky barrier diode which is externally connected, in the semiconductor device 50 provided by the embodiments of the invention, the device size may be effectively reduced, and costs may be saved. Furthermore, when the diode element 120 and the Schottky barrier diodes SBD are effectively integrated, the advantages of high punch-through voltage, fast switching speeds, and lowered shoot through currents may be achieved, and the overall performance of the device may be enhanced.

In view of the foregoing, in the embodiments of FIG. 1A to FIG. 5, the semiconductor devices all include the diode element located on the isolation structure. Here, the first metal layer and the intrinsic region of the diode element are electrically connected to form the Schottky contact, so as to constitute at least one Schottky barrier diode. Thereby, in the embodiments of the invention, the Schottky barrier diode and the diode element can be integrated to form an embedded structure. In other words, compared to the conventional Schottky barrier diode which is externally connected, in the semiconductor device provided by the embodiments of the invention, the device size may be effectively reduced, and the costs may be saved. As such, the overall design of the semiconductor device can be more flexible. Furthermore, when the diode element and the Schottky barrier diode are effectively integrated, the advantages of high punch-through voltage, fast switching speeds, and lowered shoot through currents may be achieved, and the overall performance of the device may be enhanced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, comprising:
   a substrate;
   an isolation structure located in the substrate;
   a diode element located on the isolation structure, wherein the diode element comprises a p-type doped region, an n-type doped region, and an intrinsic region, the intrinsic region is located between the p-type doped region and the n-type doped region, and the p-type doped region and the n-typed doped region located on two sides of the diode element respectively form ohmic contacts; and
   a first metal layer, electrically connected to the intrinsic region of the diode element, the first metal layer and the intrinsic region of the diode element forming a Schottky contact, so as to constitute at least one Schottky barrier diode.

2. The semiconductor device as claimed in claim 1, wherein the intrinsic region of the diode element comprises a main body portion and at least one protruding portion connected to the main body portion, the at least one protruding portion extends into the p-type doped region, and the first metal layer is electrically connected to the at least one protruding portion of the intrinsic region and the p-type doped region to constitute the at least one Schottky barrier diode.

3. The semiconductor device as claimed in claim 1, further comprising:
   a transistor, located in an active region, the isolation structure defining the active region, and the transistor comprising a gate, a first doped region, and a second doped region, wherein the gate is located on the substrate, and the first doped region and the second doped region are respectively located in the substrate on two sides of the gate.

4. The semiconductor device as claimed in claim 3, wherein the p-type doped region of the diode element is disposed adjacent to one of the first doped region and the second doped region, and the n-type doped region is disposed adjacent to the other one of the first doped region and the second doped region.

5. The semiconductor device as claimed in claim 3, wherein the isolation structure is located between the second doped region and the gate, and the diode element is located on the isolation structure between the second doped region and the gate.

6. The semiconductor device as claimed in claim 3, wherein the first metal layer is electrically connected to one of the first doped region and the second doped region.

7. The semiconductor device as claimed in claim 6, further comprising a second metal layer, wherein the second metal layer is electrically connected to the other one of the first doped region and the second doped region and is electrically connected to the n-type doped region.

8. The semiconductor device as claimed in claim 1, wherein the diode element is disposed on the isolation structure, and the p-type doped region, the n-type doped region, and the intrinsic region are respectively in contact with the isolation structure.

\* \* \* \* \*